(12) United States Patent
Hourne et al.

(10) Patent No.: US 10,626,639 B2
(45) Date of Patent: Apr. 21, 2020

(54) METHOD AND DEVICE FOR PRESENCE DETECTION FOR A MOTOR VEHICLE

(71) Applicants: Continental Automotive France, Toulouse (FR); Continental Automotive GmbH, Hannover (DE)

(72) Inventors: Xavier Hourne, Cugnaux (FR); Olivier Gerardiere, Tournefeuille (FR)

(73) Assignees: Continental Automotive France, Toulouse (FR); Continental Automotive GmbH, Hannover (DE)

( * ) Notice: Subject to any disclaimer, the term of this patent is extended or adjusted under 35 U.S.C. 154(b) by 0 days.

(21) Appl. No.: 16/342,566

(22) PCT Filed: Nov. 28, 2017

(86) PCT No.: PCT/FR2017/053272
§ 371 (c)(1),
(2) Date: Apr. 17, 2019

(87) PCT Pub. No.: WO2018/100283
PCT Pub. Date: Jun. 7, 2018

(65) Prior Publication Data
US 2020/0048940 A1     Feb. 13, 2020

(30) Foreign Application Priority Data
Nov. 29, 2016  (FR) ..................................... 16 61624

(51) Int. Cl.
*B60R 25/31* (2013.01)
*G08C 19/00* (2006.01)
*E05B 81/76* (2014.01)

(52) U.S. Cl.
CPC .............. *E05B 81/77* (2013.01); *B60R 25/31* (2013.01); *G08C 19/00* (2013.01); *E05Y 2400/86* (2013.01)

(58) Field of Classification Search
CPC .......... B60R 25/31; E05B 81/76; E05B 81/77
See application file for complete search history.

(56) References Cited

U.S. PATENT DOCUMENTS 7,205,777 B2     4/2007  Schulz et al.
2008/0277171 A1*  11/2008  Wright .................. G06F 1/3203
                                          178/18.06
(Continued)

FOREIGN PATENT DOCUMENTS

JP          1025079 A       1/1998

OTHER PUBLICATIONS

International Search Report and Written Opinion for International Application No. PCT/FR2017/053272, dated Feb. 13, 2018—14 pages.

*Primary Examiner* — Daniell L Negron
(74) *Attorney, Agent, or Firm* — RatnerPrestia

(57) ABSTRACT

A method for detecting presence close to a sensor installed in a motor vehicle, the method including: a plurality of steps of conversion, at a plurality of different values of the reference voltage, of an analog voltage signal into a plurality of different coded digital values; correlating the coded digital values in order to obtain a correlation value; comparing the obtained correlation value with a predetermined reference value; detecting human presence close to the sensor when the difference between the obtained correlation value and the predetermined reference value is greater than a predetermined detection threshold.

7 Claims, 4 Drawing Sheets

(56) References Cited

U.S. PATENT DOCUMENTS

2016/0078701 A1  3/2016  Guibbert et al.
2016/0318480 A1  11/2016 Menard et al.

* cited by examiner

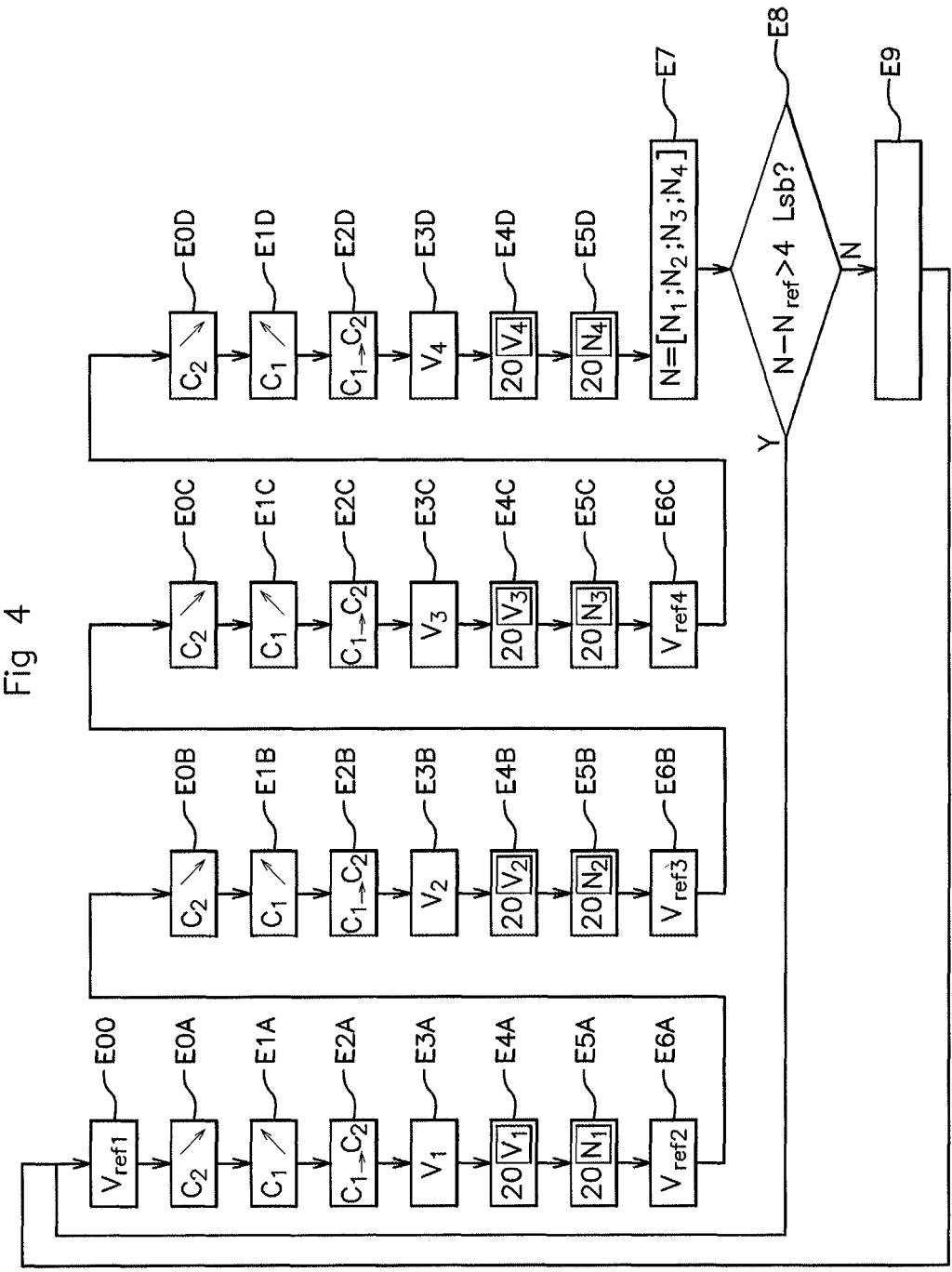

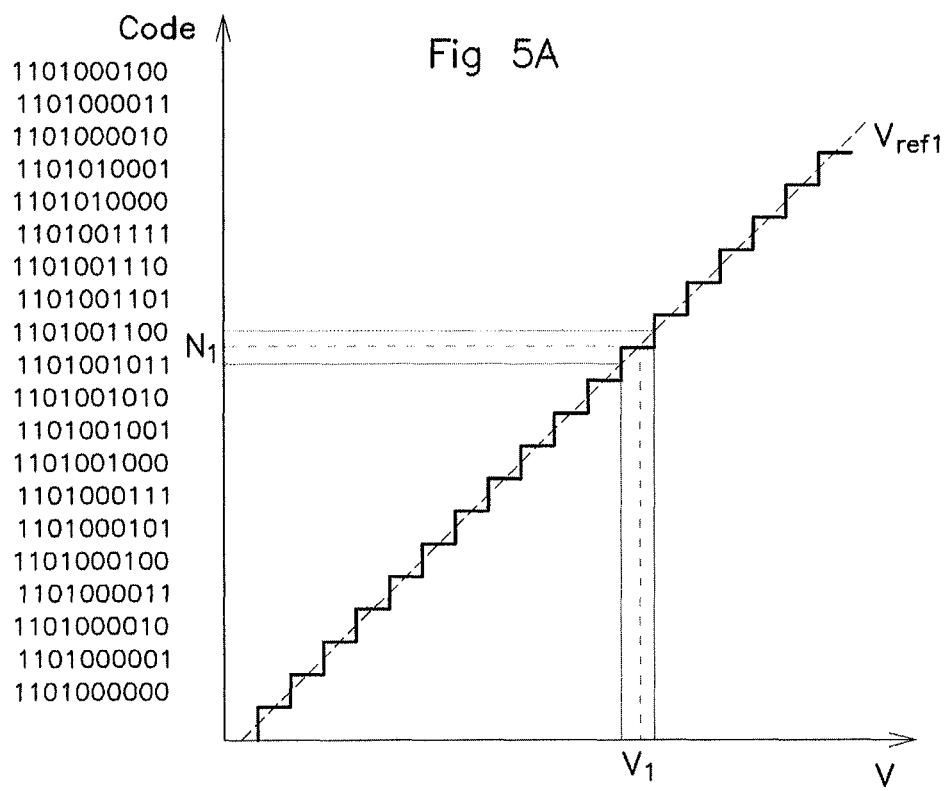
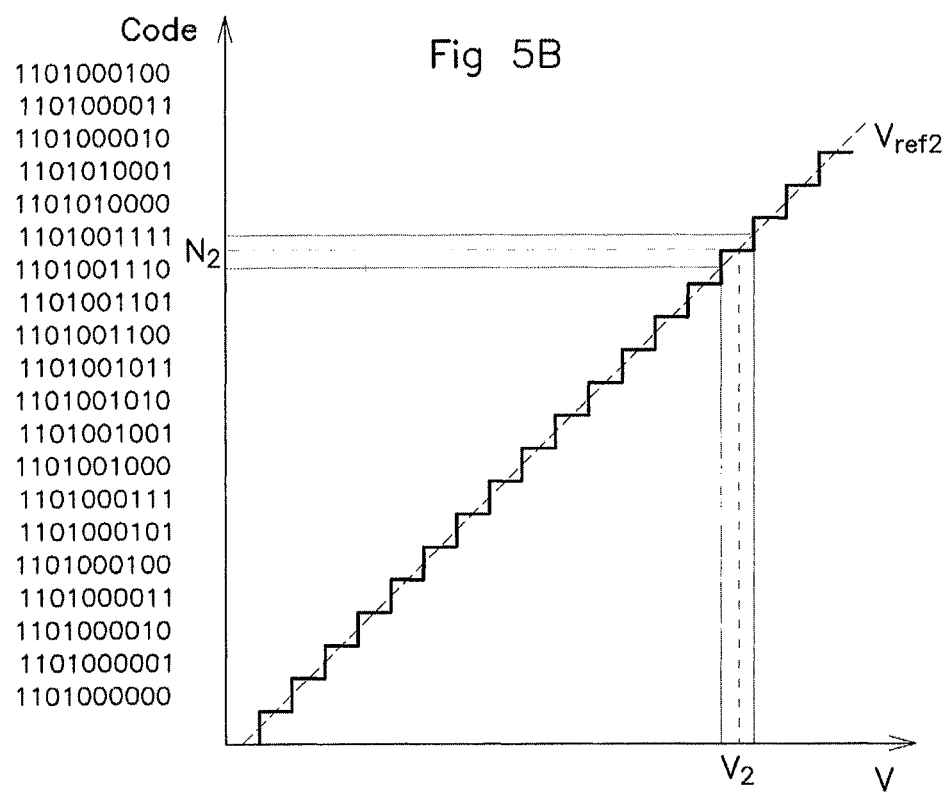

METHOD AND DEVICE FOR PRESENCE DETECTION FOR A MOTOR VEHICLE

CROSS REFERENCE TO RELATED APPLICATIONS

This application is the U.S. National Phase Application of PCT International Application No. PCT/FR2017/053272, filed Nov. 28, 2017, which claims priority to French Patent Application No. 1661624, filed Nov. 29, 2016, the contents of such applications being incorporated by reference herein.

FIELD OF THE INVENTION

The present invention pertains to the field of motor vehicles, and relates more particularly to a method and a device for presence detection for a motor vehicle. The invention applies in particular to detecting the presence of a hand on a door handle of a motor vehicle so as to unlock the passenger compartment thereof.

BACKGROUND OF THE INVENTION

In a motor vehicle, it is known to use a device for detecting the presence of a human hand on the handle of a door of the vehicle so as to unlock access to the passenger compartment thereof.

As is known, such a device comprises a sensor, installed at least partly in the handle, a converter and a microcontroller. During operation of the device, the sensor generates a voltage signal representative of the presence or of the absence of a hand on the handle, and the converter converts this analog signal into a digital value according to its amplitude, such that the microcontroller is able to detect the presence of a hand on the handle and unlock the passenger compartment.

In one known measurement solution, said to be "capacitive", the sensor comprises a first capacitor, called "reference capacitor", which is periodically charged and discharged into a second capacitor, called "storage capacitor". When the reference capacitor discharges into the storage capacitor, the charges are balanced between the two capacitors. As is known, the analog voltage signal generated by the sensor is representative of the value of the voltage measured across the terminals of the storage capacitor when the charges are balanced.

When a human hand is present on the handle or close to the handle, for example less than 10 mm away, the level of charge of the reference capacitor increases. This results in a larger discharge of the reference capacitor into the storage capacitor, and therefore a higher level of balancing in the presence than in the absence of a hand on the handle.

The analog-to-digital converter (or ADC) makes it possible to convert the analog voltage measured by the sensor, representing the level of charge of the storage capacitor, into a coded digital value based on a reference voltage. In theory, each digital value corresponds, as is known, to a different analog voltage value interval but with a width equal to 1 LSB ("least significant bit"), the set of consecutive analog voltage value intervals extending over a range of voltage values whose width corresponds to the reference voltage of the converter.

As is known, coding on N bits makes it possible to use $2^N$ digital coding values (or levels). By way of example and with reference to FIG. 1, coding may be performed on 3 bits. Such coding thus makes it possible to use $2^3$, that is to say 8 digital values, defined by binary elements 000 to 111. In this example, the input voltage value $V_1$ belongs to an analog voltage value interval corresponding to the digital coding value 100 in the example of FIG. 1.

The accuracy of the converter depends on the number of bits used to code the various digital values. Thus, the higher the number of bits, the more the resolution of the converter increases. A problem arises when the variation in the capacitance that it is desired to measure is low in comparison with the resolution of the converter. The result of this is that measured values that are far apart may be situated in the same analog voltage value interval and thus correspond to one and the same coded digital value, thus preventing any detection. There are several ways of rectifying this problem. A first known solution consists in increasing the number of coding bits of the converter, but this makes it more complex and more expensive, thereby exhibiting a drawback. A second known solution consists in oversampling the signal, which increases the resolution but requires significant processing capabilities, thereby exhibiting another drawback. In addition, a noise greater than 1 LSB is necessary at the input of the sensor in order to be able to use this oversampling technique, this not been the case in some types of sensor.

Moreover, in practice, it is generally observed that the resolution of the converter is not constant, this being reflected by the fact that the coded digital values generated by the converter correspond to analog voltage value intervals of different widths.

The difference in width between two consecutive intervals, as is known, is called differential non-linearity (or DNL) error. This differential non-linearity error is expressed in LSB. In theory, as mentioned above, the width of an analog voltage value interval corresponding to a coded digital value has a value of 1 LSB, but in practice this value varies by a difference, for example between more or less 1.5 LSB, which corresponds to the DNL error. Thus, a DNL error of more or less 1.5 LSB over all of the digital values leads to digital interval widths of between −0.5 LSB (which corresponds in practice to the digital value disappearing) and +2.5 LSB, that is to say two and a half times the theoretical width of an interval.

In order to detect the presence of a hand on a door handle of the vehicle with certainty, the measured difference between the digital values in the absence of a hand and the digital values obtained in the presence of a hand should be greater than a predetermined value. By way of example, the predetermined value representative of the presence of a hand may be 2 LSB, this value therefore representing a difference of two coded digital values.

With reference to FIG. 1, two analog voltage values $V_1$ and $V_2$ are representative of the absence and of the presence of a hand, respectively. In the theoretical case of a converter having a constant resolution, the two analog voltage values $V_1$ and $V_2$ belong to two different analog voltage value intervals corresponding to two different digital values (100 and 110 according to the example cited and presented in FIG. 1). As the two digital values are spaced by 2 LSB, this results in unlocking of the door of the vehicle.

Therefore, when the DNL error is large on a coded digital value, several input analog voltage values belonging to different analog voltage value intervals may correspond at output to this same digital value. In other words, when the predetermined difference for detecting a hand on the handle of the vehicle, for example 2 LSB, is less than the maximum value of the DNL error (for example 2.5 LSB), analog voltage values measured with or without the hand may have one and the same digital value at the output of the converter, thereby preventing detection of the hand on the handle and therefore exhibiting a major drawback. By way of example, with reference to FIG. 2, a converter may have a DNL error that leads to the occurrence of analog voltage intervals with a width of 2.5 LSB. Thus, output analog voltage values $V_1$ and $V_2$ from the sensor, which are identical to the example of FIG. 1, in this case correspond to one and the same output digital coding level (100 according to the cited example), whereas they correspond in theory to two digital values spaced by 2 LSB (100 and 110 in FIG. 1).

In the prior art, when the difference between two digital values is small, for example 2 LSB, it is possible to oversample the signal so as to increase the sensitivity of the system. However, such oversampling does not make it possible to solve the drawbacks linked to the DNL error. In addition, as explained above, noise is necessary at the input of the sensor in order to perform such sampling, of greater than 1 LSB, in order to detect a difference of 2 LSB, which is not the case in some sensors.

SUMMARY OF THE INVENTION

The aim of an aspect of the invention is to at least partly rectify these drawbacks by proposing a simple, reliable and effective solution for detecting the presence of a hand on or close to a handle of a motor vehicle.

To this end, an aspect of the invention first of all relates to a method for detecting human presence close to a sensor installed in a motor vehicle, said motor vehicle furthermore comprising a converter and a microcontroller, said sensor being able to provide a presence-detection analog voltage signal to said converter, said converter being able to convert said analog voltage signal into a coded digital value and to provide said coded digital value to the microcontroller, the converter being characterized by its predetermined finite number of successive coded digital values corresponding to a series of consecutive intervals of values of the analog voltage signal, the length of said series of consecutive intervals corresponding to a reference value of the converter, the method being noteworthy in that it comprises:
  a plurality of steps of conversion, by the converter, at a plurality of different values of the reference voltage, of an analog voltage signal into a plurality of different coded digital values,
  a step of correlating said coded digital values in order to obtain a correlation value,
  a step of comparing the obtained correlation value with a predetermined reference value,
  a step of detecting human presence close to the sensor when the difference between the obtained correlation value and the predetermined reference value is greater than a predetermined detection threshold.

Such a method makes it possible to detect the presence of a hand when it approaches the handle of a motor vehicle. Specifically, the method according to an aspect of the invention makes it possible to eliminate the impact of cases of digital conversion errors of the analog voltage signal by performing conversions at various reference voltages. Thus, for one and the same value of the analog voltage signal (to within noise), a conversion error on a measurement has a low impact on the detection, given that the erroneous digital value that is obtained will be diluted by its correlation with the other digital values obtained by conversion at various reference values. The method thus makes it possible to ensure that the measured difference between the digital values in the absence of a hand and the digital values obtained in the presence of a hand is greater than a predetermined detection value, such that the detection is reliable.

Advantageously, with the method comprising consecutive intervals of values of the analog voltage signal that are characterized by a maximum width, the absolute difference between two values of the reference voltage is greater than said maximum width. This makes it possible to overcome the risk of incorrect reading of a digital value if a non-linearity error is present.

Advantageously, with the sensor comprising a reference capacitor and a storage capacitor, the steps of converting the analog voltage signal into a coded digital value are performed between a step of charging the storage capacitor and a step of completely discharging the storage capacitor.

Advantageously, the method comprises four steps of conversion of the analog voltage signal by the converter at four different reference voltages, into four coded digital values, the absolute difference between two consecutive values of the reference voltage being greater than a predetermined detection threshold. This makes it possible to increase the resolution of the converter, while thus obtaining a more accurate measurement.

An aspect of the invention also relates to a device for detecting human presence close to a motor vehicle, said device comprising a detection sensor able to provide a presence-detection analog voltage signal, a converter able to convert said analog voltage signal into at least one coded digital value and a microcontroller able to receive said coded digital value, said converter being characterized by its predetermined finite number of successive coded digital values corresponding to a series of successive intervals of values of the analog voltage signal, the length of said series of consecutive intervals corresponding to a reference value of the converter, the device being characterized in that the microcontroller is able to apply a plurality of different reference voltage values to the converter and in that the converter is configured so as to convert, at said plurality of values of the reference voltage, an analog voltage signal provided by the sensor into a plurality of coded digital values, said consecutive intervals of values of the analog voltage signal of the converter being characterized by a maximum width, the absolute difference between two values of the reference voltage is greater than said maximum width, the microcontroller furthermore being configured so as to correlate said coded digital values in order to obtain a correlation value, compare the obtained correlation value with a predetermined reference value, and detect human presence close to the sensor when the difference between the obtained correlation value and the predetermined reference value is greater than a predetermined detection threshold.

Advantageously, with the sensor comprising a reference capacitor and a storage capacitor, the microcontroller is able to command the conversion of the analog voltage signal into a coded digital value between charging of the storage capacitor and complete discharging of the storage capacitor.

The absolute difference between two consecutive values of the reference voltage is preferably greater than a predetermined detection threshold so as to ensure that the conversions are performed in intervals having non-linearity errors that are different, and thus avoid detection errors.

An aspect of the invention relates lastly to a motor vehicle comprising a device for detecting human presence such as presented above.

BRIEF DESCRIPTION OF THE DRAWINGS

Other features and advantages of aspects of the invention will emerge during the following description, given with reference to the appended figures, which are given by way of nonlimiting example and in which identical references are given to similar objects.

FIG. 4 illustrates one embodiment of the detection method according to an aspect of the invention.

FIGS. 5A and 5B illustrate graphs of the conversion of an analog voltage signal value into two different digital values at two different reference voltage values.

DETAILED DESCRIPTION OF THE PREFERRED EMBODIMENTS

The presence detection device according to an aspect of the invention is intended to be installed in a motor vehicle, for example in connection with a handle for opening a door of the vehicle so as to allow the passenger compartment of the vehicle to be unlocked. It goes without saying that the detection device according to an aspect of the invention could be installed at any other suitable location of the vehicle, for example on the trunk in order to unlock it.

Figure 3:
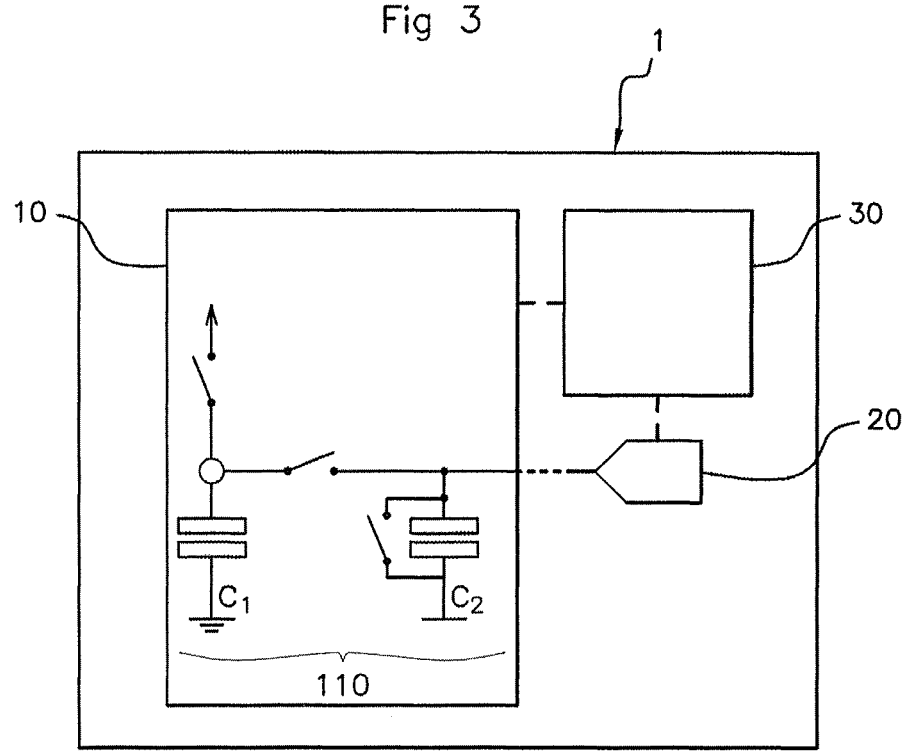
FIG. 3 schematically shows one embodiment of a detection device according to an aspect of the invention.

With reference first of all to FIG. 3, the device 1 according to an aspect of the invention comprises a detection sensor 10, a converter 20 and a microcontroller 30.

The sensor 10 makes it possible to provide the converter 20 with an analog voltage signal representative of the absence or of the presence of a hand, for example less than 10 mm away from the handle.

To this end, with continuing reference to FIG. 3, the sensor 10 comprises what is known as a "reference" capacitor $C_1$ and what is known as a "storage" capacitor $C_2$.

During operation of the sensor 10, said sensor is configured so as to periodically:

charge the reference capacitor $C_1$ to its maximum level of charge, discharge it into the storage capacitor $C_2$ such that the two capacitors $C_1$, $C_2$ balance, measure the voltage across the terminals of the storage capacitor $C_2$, and discharge the storage capacitor $C_2$ (or even the two capacitors $C_1$, $C_2$) before restarting.

The output analog voltage signal from the sensor 10 then corresponds to the voltage measured across the terminals of the storage capacitor $C_2$.

In the absence of a hand on the handle, the value of the voltage measured by the sensor 10 is substantially constant. When a hand approaches the handle, the maximum level of charge of the reference capacitor $C_1$ increases. In doing so, the level of balancing between the two capacitors $C_1$, $C_2$, resulting from the reference capacitor $C_1$ discharging into the storage capacitor $C_2$, in turn increases. This results in a higher measured voltage across the terminals of the storage capacitor $C_2$, which then makes it possible, when the difference from a previous measured voltage is large enough, to detect the presence or the approach of a hand on the handle.

Such an assembly is called capacitive voltage divider 110, denoted CVD. In order to operate, this assembly furthermore comprises, as is known, switches and means for commanding said switches, which are known per se and which will therefore not be described in more detail here.

As a variant, the sensor 10 may take the form of an assembly called differential capacitive voltage divider 110 or DCVD. In a DCVD assembly, the sensor 10 periodically charges and discharges the reference capacitor $C_1$ into the storage capacitor $C_2$ to be measured, as in the CVD assembly, but furthermore performs a second reverse step. More precisely, when the voltage across the terminals of the storage capacitor $C_2$ has been measured and the two capacitors $C_1$ and $C_2$ have been discharged, the storage capacitor $C_2$ is charged to its maximum level and then discharged into the reference capacitor $C_1$. Thus, when a hand is situated close to the reference capacitor $C_1$ and the maximum level of charge thereof increases, discharging the storage capacitor $C_2$ into the reference capacitor $C_1$ will result in a lower level of balancing, and therefore in a lower measured voltage than in the case of the first step. In practice, the pairwise difference between the voltage values measured in the first step and in the second step is used, and a hand is detected on the handle when this difference exceeds a predetermined value. The benefit of this DCVD assembly in comparison with the CVD assembly lies in the fact that it allows noise to be overcome, in particular at low frequencies, and thus makes it possible to increase the quality of the detection, an aspect of the invention applying indiscriminately to a CVD or DCVD assembly.

The converter 20 is electrically linked to the sensor 10 so as to receive the analog voltage signal provided by the sensor 10.

More precisely, the converter 20 is an analog-to-digital converter (or ADC) for converting the analog voltage signal provided by the sensor 10 into a digital value based on a reference voltage so that the microcontroller 30 is able to use it to detect or not to detect the presence of a hand on the handle.

The converter 20 generates a digital value coded on a number N of bits, making it possible to use $2^N$ digital values.

Figure 1:
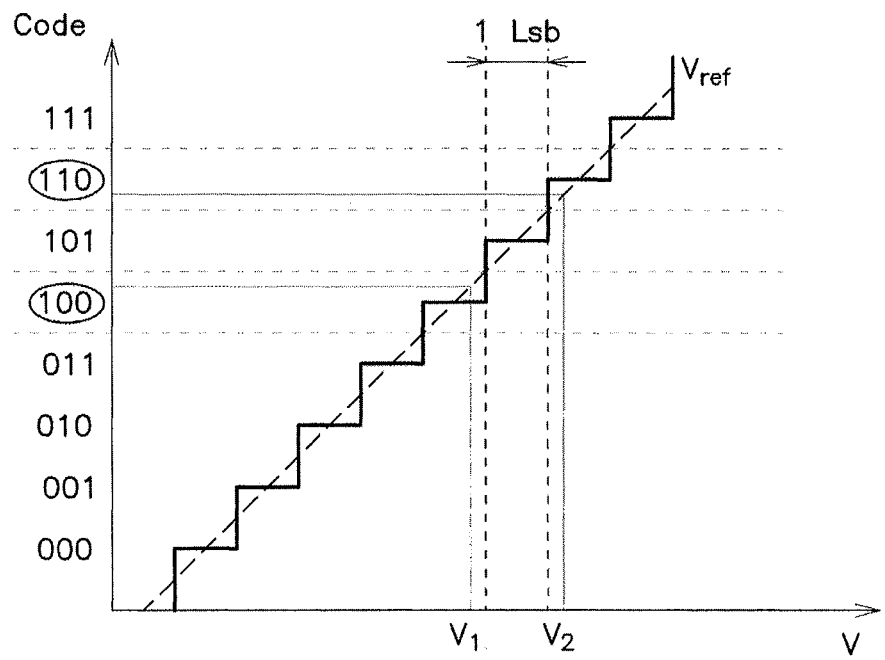
FIG. 1 (already commented upon) shows a graph of a digital conversion of an analog voltage signal value by a converter not having a non-linearity error.

In theory, as illustrated in FIG. 1, each digital value corresponds to a different analog voltage value interval, but with a width equal to 1 LSB ("least significant bit"). The set of consecutive analog voltage value intervals extends over a voltage value range whose width corresponds to the reference voltage of the converter 20.

Figure 2:
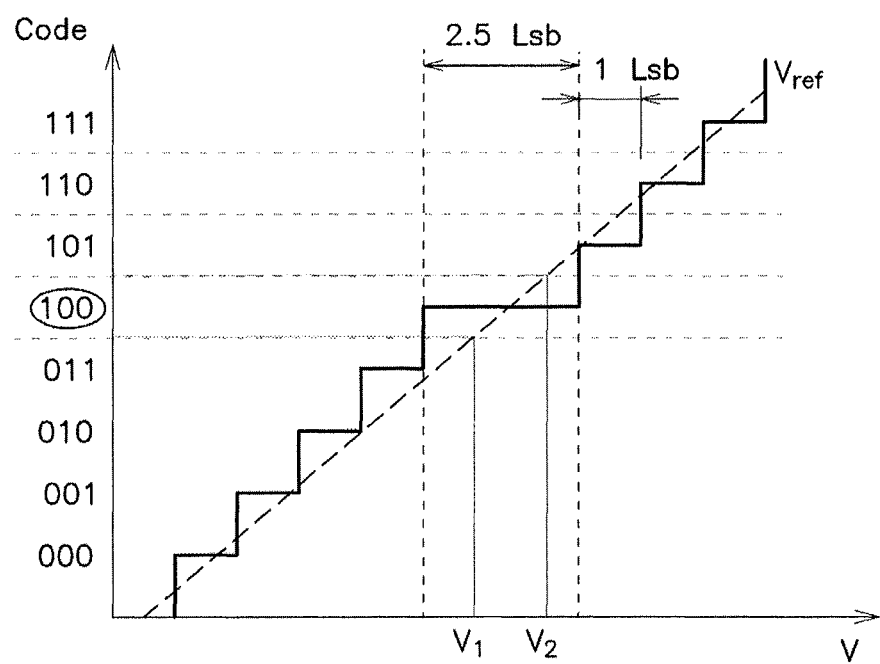
FIG. 2 (already commented upon) shows a graph of a digital conversion of an analog voltage signal value by a converter having a non-linearity error.

In practice, as illustrated in FIG. 2, it is however observed that the length of each bit of the converter 20 is not constant, this being reflected by the fact that the coded digital values generated by the converter 20 may correspond to analog voltage value intervals of different widths.

The difference in width between two consecutive intervals is called differential non-linearity (or DNL) error. This differential non-linearity error is expressed in LSB. In theory, the width of an analog voltage value interval corresponding to a coded digital value has a value of 1 LSB, but in practice this value varies by a difference, for example between more or less 1.5 LSB, which corresponds to the DNL error. Thus, a DNL error of more or less 1.5 LSB leads to digital interval widths of between −0.5 LSB (which corresponds in practice to the digital value disappearing) and +2.5 LSB.

In order to detect the presence of a hand on the handle of the vehicle with certainty, an aspect of the present invention makes it possible to ensure that the measured difference between the digital values in the absence of a hand and the digital values obtained in the presence of a hand is greater than a predetermined detection value, for example 4 LSB.

To this end, the converter 20 is configured so as to convert the analog voltage signal provided by the sensor 10 over a predetermined time interval at a plurality of different reference voltage values so as to obtain a plurality of different digital values.

The microcontroller 30 is electrically linked to the converter 20 so as to receive the digital values provided at output by the converter 20. In this nonlimiting example, the converter 20 and the microcontroller 30 take the form of two electrically linked separate physical entities. However, as a variant, it will be noted that the converter 20 could be integrated into the microcontroller 30 in a known manner, i.e. the converter 20 and the microcontroller 30 form a single physical entity.

According to an aspect of the invention, the microcontroller 30 is configured so as to:
  successively command the application of a plurality of different reference voltage values to the converter 20,
  read the coded digital values provided by the converter 20 for the various reference voltage values,
  calculate a correlation value N by applying a mathematical function to said plurality of coded digital values, for example by calculating an average, and
  compare the calculated value N with a predetermined detection value $N_{ref}$ so as to detect or not to detect the presence of a hand on the handle.

For example, the presence of a hand is detected on the handle when the difference between the calculated value N and a predetermined value $N_{ref}$ representative of human absence close to the sensor is greater than a predetermined detection threshold, for example 4 LSB.

An aspect of the invention will now be described in terms of the implementation thereof with reference to FIG. 4. In this example, it is considered that the converter 20 is coded on N=10 bits, that is to say that it is divided into $2^{10}$, that is to say 1024 coding levels (from level 0 to level 1023) corresponding to 1024 voltage value intervals. It goes without saying that, as a variant, any coding on a different number of bits could be used.

Furthermore, a CVD sensor 10 and four different reference voltage values $V_{ref1}$, $V_{ref2}$, $V_{ref3}$, $V_{ref4}$ will be used in the example described below. The example cited in this document presents an aspect of the invention for four different reference voltage values, but it goes without saying that any number of voltage values may be used, as long as it is greater than or equal to two.

It is considered that, in the initial state, no human hand is present on the handle of the vehicle.

With reference to FIGS. 3 and 4, the microcontroller 30 first of all commands the application of a first reference voltage $V_{ref1}$ to the converter 20 in a preliminary step E00.

The storage capacitor $C_2$ is initially completely discharged in a step E0A.

The reference capacitor $C_1$ of the sensor 10 is then charged in a step E1A and then discharged into the storage capacitor $C_2$ in a step E2A, thus defining a first analog voltage value $V_1$ across the terminals of the storage capacitor $C_2$ in a step E3A. This first value $V_1$ is then read by the converter 20 in a step E4A, which converts it, in a step E5A, into a first coded digital value $N_1$ based on the first reference voltage $V_{ref1}$. This first coded digital value $N_1$ is then stored by the microcontroller 30. The microcontroller 30 commands the application of a second reference voltage $V_{ref2}$ to the converter 20 in a step E6A.

The storage capacitor $C_2$ is then completely discharged in a step E0B. The reference capacitor $C_1$ of the sensor 10 is then charged in a step E1B and then discharged into the storage capacitor $C_2$ in a step E2B, thus defining a second analog voltage value $V_2$ across the terminals of the storage capacitor $C_2$ in a step E3B. This second value $V_2$ is then read by the converter 20 in a step E4B, which converts it, in a step E5B, into a second coded digital value $N_2$ based on the second reference voltage $V_{ref2}$, different from the first reference voltage $V_{ref1}$. The change in the reference voltage of the converter 20 modifies the conversion scale thereof, such that the width of the set of measurement intervals of the converter 20 is different for two different reference voltages. Thus, for a first analog voltage value $V_1$ and a second analog voltage value $V_2$ of the same order, a first coded digital value $N_1$ and a second coded digital value $N_2$ that are different are obtained. This second value $N_2$ is then stored by the microcontroller 30. The microcontroller 30 commands the application of a third reference voltage $V_{ref3}$ to the converter 20 in a step E6B.

The storage capacitor $C_2$ is then completely discharged in a step E0C. The reference capacitor $C_1$ of the sensor 10 is charged again in a step E1C and then discharged into the storage capacitor $C_2$ in a step E2C, thus defining a third analog voltage value $V_3$ across the terminals of the storage capacitor $C_2$ in a step E3C. This third value $V_3$ is then read by the converter 20 in a step E4C, which converts it, in a step E5C, into a third coded digital value $N_3$ based on the third reference voltage $V_{ref3}$, different from the first reference voltage $V_{ref1}$ and from the second reference voltage $V_{ref2}$. The change in the reference voltage of the converter 20 modifies the conversion scale thereof again, such that the width of the set of measurement intervals of the converter 20 is different from that of the first reference voltage $V_{ref1}$ and of the second reference voltage $V_{ref2}$. Thus, for a first analog voltage value $V_1$, a second analog voltage value $V_2$ and a third analog voltage value $V_3$ of the same order, a first coded digital value $N_1$, a second coded digital value $N_2$ and a third coded digital value $N_3$ that are different are obtained. This third value $N_3$ is then stored by the microcontroller 30. The microcontroller 30 commands the application of a fourth reference voltage $V_{ref4}$ to the converter 20 in a step E6C.

The storage capacitor $C_2$ is then completely discharged in a step E0D. The reference capacitor $C_1$ of the sensor 10 is then charged again in a step E1D and then discharged into the storage capacitor $C_2$ in a step E2D, thus defining a fourth analog voltage value $V_4$ across the terminals of the storage capacitor $C_2$ in a step E3D. This fourth value $V_4$ is then read by the converter 20 in a step E4D, which converts it, in a step E5D, into a fourth coded digital value $N_4$ based on the fourth reference voltage $V_{ref4}$, different from the first reference voltage $V_{ref1}$, from the second reference voltage $V_{ref2}$ and from the third reference voltage $V_{ref3}$.

It will be noted that the first analog voltage value $V_1$, the second analog voltage value $V_2$, the third analog voltage value $V_3$ and the fourth analog voltage value $V_4$ are equal in theory, but to within electronic noise, thereby in practice making them substantially equal but not necessarily strictly equal. Specifically, for a given state of human presence or absence close to the vehicle, the converted analog voltage signal is singular, but its value may vary slightly over time depending on electronic noise.

The change in the reference voltage of the converter 20 modifies the conversion scale thereof again, such that the width of the set of measurement intervals of the converter 20 is different from that of the first reference voltage $V_{ref1}$, of the second reference voltage $V_{ref2}$, of the third reference voltage $V_{ref3}$ and of the fourth reference voltage $V_{ref4}$. Thus, for a first analog voltage value $V_1$, a second analog voltage value $V_2$, a third analog voltage value $V_3$ and a fourth analog voltage value $V_4$ of the same order, a first coded digital value $N_1$, a second coded digital value $N_2$, a third coded digital value $N_3$ and a fourth coded digital value $N_4$ that are different are obtained. This fourth value $N_4$ is then stored by the microcontroller 30.

Once the first coded digital value $N_1$, the second coded digital value $N_2$, the third coded digital value $N_3$ and the fourth coded digital value $N_4$ have been stored, the microcontroller 30 applies a mathematical function to these four values in a step E7 so as to deduce a correlative value N therefrom. For example, the microcontroller 30 may add the four values $N_1$, $N_2$, $N_3$, $N_4$ and divide them by two in order to obtain a double average for doubling sensitivity with respect to the converter 20.

The microcontroller 30 performs steps E00 to E7 periodically, the obtained correlative values N being of the same order, for example at more or less 4 LSB maximum difference, for as long as no hand is present on the door handle of the vehicle.

When a user of the vehicle brings the hand close enough to the door handle in order to unlock it, the level of charge of the reference capacitor $C_1$ increases, leading to a measured voltage across the terminals of the storage capacitor $C_2$ that is higher than in the absence of a hand, as explained above.

This results in higher voltage values $V_1$, $V_2$, $V_3$, $V_4$ and therefore a higher calculated correlative value N as well in steps E00 to E7.

In a step E8, the microcontroller 30 then compares the correlative value calculated in the absence of a hand (reference value $N_{ref}$) and the correlative value N calculated in the presence of a hand and detects a hand on the handle, in a step E9, when the difference between the correlative value N calculated in the presence of a hand and the correlative reference value $N_{ref}$ calculated in the absence of a hand is greater than a predetermined threshold, for example 4 LSB.

In the example given in FIGS. 5A and 5B (between which the voltage scale shown on the abscissa is different due to different reference voltages $V_{ref1}$ and $V_{ref2}$), it is seen that, for one and the same voltage value of the analog signal $V_1=V_2$, two different digital values $N_1$ and $N_2$ are obtained that are spaced by 3 LSB: $N_1=N_2+3$ LSB. It thus turns out that, if one of these digital values $N_1$ and $N_2$ is a bit having a large DNL error, the presence of the other value will make it possible to compensate the error such that an erroneous detection will not be performed, the correlation between the digital values $N_1$ and $N_2$ (for example in the form of an average) reducing the initial error.

Figure 6:
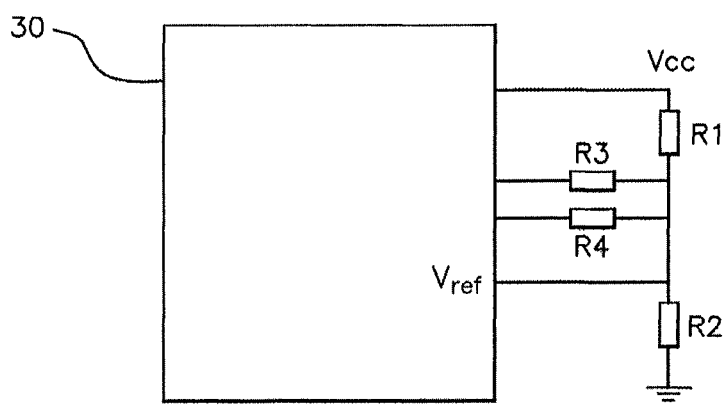
FIG. 6 schematically shows an adjustment circuit for adjusting the reference voltage of the converter of the device of FIG. 3.

With reference to FIG. 6, a circuit for adjusting the reference voltage is shown, making it possible to modify said reference voltage and thus to determine the four reference voltage values $V_{ref1}$, $V_{ref2}$, $V_{ref3}$, $V_{ref4}$.

The resistors R1 and R2 set the default value of the divider bridge. This divider bridge is supplied by an input/output (I/O) of the microcontroller 30 so as to be turned off when measurements are not being performed. These resistors R1 and R2 will set the initial value of the reference voltage $V_{ref}$. This reference voltage $V_{ref}$ is set as low as possible, while ensuring that saturation is never reached.

In order to use a plurality of reference voltage values $V_{ref1}$, $V_{ref2}$, $V_{ref3}$, $V_{ref4}$, two resistors R3 and R4 connected to the microcontroller 30 are added. Said resistors are linked alternately to ground M or to the supply voltage Vcc of the microcontroller 30, that is to say four different combinations.

In order to have four different reference voltage values $V_{ref1}$, $V_{ref2}$, $V_{ref3}$, $V_{ref4}$, different values are chosen for the resistors R3 and R4.

In the following example, R3 and R4 are calculated such that the minimum jump of the measured digital value is 4 LSB.

To set the values of the resistors R1, R2, R3, R4, R1 and R2 are set first of all without considering R3 and R4.

The resistors R1 and R2 constitute the main divider bridge that will define the voltage around which the various reference voltage values $V_{ref1}$, $V_{ref2}$, $V_{ref3}$, $V_{ref4}$ will evolve.

The reference voltage $V_{ref}$ as a function of the supply voltage Vcc is then given by:

$$V_{ref} = \frac{R2}{R1+R2} * V_{CC}$$

The choice of the resistors R1 and R2 depends on the supply voltage $V_{cc}$, for example 3 V, and a desired central reference voltage value $V_{ref}$, for example 2.5 V. As the resistors R1 and R2 constitute a voltage divider bridge 110, R1=2 kΩ and R2=10 kΩ is set, for example.

In order to generate the voltages $V_{ref1}$, $V_{ref2}$, $V_{ref3}$, $V_{ref4}$, the values of R1 and R2 are modified slightly. To achieve this, two resistors R3 and R4 are added in parallel and the ports of the microcontroller 30 to which they are connected are linked alternately to 0 (ground) or to 1 (Vcc), thereby giving four combinations.

A new divider bridge is then obtained, whose new equivalent resistors are named R1' and R2', making it possible to deduce:

$$Vref_i = \frac{R2'}{R1' + R2'} * V_{CC}$$

where i=1, 2, 3 or 4.

The values of the resistors R1', R2' are then replaced by the data from the following table (where "//" denotes a parallel assembly for the sake of conciseness):

|  | R1' | R2' |
|---|---|---|
| $V_{ref1}$ | R1' = R1 | R2' = R2//R3//R4 |
|  |  | $R2' = \dfrac{1}{\frac{1}{R2} + \frac{1}{R3} + \frac{1}{R4}}$ |
| $V_{ref2}$ | R1' = R1//R4 | R2' = R2//R3 |
|  | $R1' = \dfrac{1}{\frac{1}{R1} + \frac{1}{R4}}$ | $R2' = \dfrac{1}{\frac{1}{R2} + \frac{1}{R3}}$ |
| $V_{ref3}$ | R1' = R1//R3 | R2' = R2//R4 |
|  | $R1' = \dfrac{1}{\frac{1}{R1} + \frac{1}{R3}}$ | $R2' = \dfrac{1}{\frac{1}{R2} + \frac{1}{R4}}$ |
| $V_{ref4}$ | R1' = R1//R3//R4 | R2' = R2 |

| R1' | R2' |
|---|---|
| $R1' = \dfrac{1}{\dfrac{1}{R1}+\dfrac{1}{R3}+\dfrac{1}{R4}}$ | |

In order to guarantee small voltage differences $\Delta V_{ref}$ with respect to the value of the reference voltage $V_{ref}$, it is chosen that R3>>R1 (">>" indicating "much higher"), R3>>R2, R4>>R1 and R4>>R2.

Moreover, R3 has to have a value different from R4, otherwise $V_{ref2}=V_{ref3}$.

With this being the case, a large number of pairs of values R3, R4 meet the requirement. For example, the values R3=68 kΩ and R4=100 kΩ, which meet these conditions, are chosen. The values thus defined make it possible to obtain the following four reference voltage values $V_{ref}$:

$V_{ref1}$=2.4 V
$V_{ref2}$=2.449 V
$V_{ref3}$=2.472 V
$V_{ref4}$=2.52 V.

In order to guarantee a minimum jump in the number of LSB in order to avoid DNL errors, it is possible to calculate a minimum difference $\Delta V_{ref\_min}$ between two consecutive values of the reference voltage and then check that the reference voltage values $V_{ref1}$, $V_{ref2}$, $V_{ref3}$, $V_{ref4}$ are sufficiently consecutively spaced in pairs.

For an analog-to-digital converter 20, the following equation is obtained:

$$1023*\frac{Vin}{Vref} - 1023*\frac{Vin}{Vref+\Delta Vref} \geq \Delta\_LSB$$

where $V_{in}$ is the input voltage of the converter 20, $V_{ref}$ is the reference voltage applied to the converter 20, $\Delta V_{ref}$ is the difference between two reference voltages and $\Delta\_LSB$ is the predetermined minimum number of LSB for detecting presence on the handle.

With $\Delta\_LSB$=4, there is then determined:

$$\Delta Vref\_min \geq \frac{4*Vref^2}{1023*\left(Vin\_min - \dfrac{4*Vref}{1023}\right)}$$

The input voltage $V_{in\_min}$ corresponds to the expected minimum voltage depending on the tolerances of the various capacitors of the circuit. In addition, in order never to reach saturation of the converter 20, it is necessary to ensure that the reference voltage $V_{ref}$ is higher than a maximum input voltage Vin_max, which corresponds, as is known, to the expected maximum voltage depending on the tolerances of the various capacitors of the circuit.

The numerical application of the above example gives, with R1=2 kΩ, R2=10 kΩ, Vcc=3 V and a minimum input voltage $V_{in\_min}$ of 1.08 V, $\Delta V_{ref\_min}$=23 mV is deduced therefrom.

The invention claimed is:

1. A method for detecting human presence close to a sensor installed in a motor vehicle, said motor vehicle furthermore comprising a converter and a microcontroller, said sensor being able to provide a presence-detection analog voltage signal to said converter, said converter being able to convert said analog voltage signal into a coded digital value and to provide said coded digital value to the microcontroller, the converter being characterized by its predetermined finite number of successive coded digital values corresponding to a series of consecutive intervals of values of the analog voltage signal, the length of said series of consecutive intervals corresponding to a reference value of the converter, the method comprising:
 a plurality of steps of conversion, by the converter, at a plurality of different values of the reference voltage, of an analog voltage signal into a plurality of different coded digital values,
 correlating said coded digital values in order to obtain a correlation value,
 comparing the obtained correlation value with a predetermined reference value,
 detecting human presence close to the sensor when the difference between the obtained correlation value and the predetermined reference value is greater than a predetermined detection threshold,
wherein, with the sensor comprising a reference capacitor and a storage capacitor, the steps of converting the analog voltage signal into a coded digital value are performed between a step of charging the storage capacitor and a step of completely discharging the storage capacitor.

2. The method as claimed in claim 1, wherein, with the consecutive intervals of values of the analog voltage signal being characterized by a maximum width, an absolute difference between two values of the reference voltage is greater than said maximum width.

3. The method as claimed in claim 1, comprising four steps of conversion of the analog voltage signal by the converter at four different reference voltages, into four coded digital values, an absolute difference between two consecutive values of the reference voltage being greater than a predetermined detection threshold.

4. A device for detecting human presence close to a motor vehicle, said device comprising:
 a detection sensor able to provide a presence-detection analog voltage signal,
 a converter able to convert said analog voltage signal into at least one coded digital value and
 a microcontroller able to receive said coded digital value,
 said converter being characterized by its predetermined finite number of successive coded digital values corresponding to a series of successive intervals of values of the analog voltage signal, the length of said series of consecutive intervals corresponding to a reference value of the converter and
  the microcontroller being able to apply a plurality of different reference voltage values to the converter and
  the converter being configured so as to convert, at said plurality of values of the reference voltage, an analog voltage signal provided by the sensor into a plurality of coded digital values, said consecutive intervals of values of the analog voltage signal of the converter being characterized by a maximum width, the absolute difference between two values of the reference voltage being greater than said maximum width,
  the microcontroller furthermore being configured so as to:
   correlate said coded digital values in order to obtain a correlation value,
   compare the obtained correlation value with a predetermined reference value, and detect human presence close to the sensor when the difference between the obtained correlation value and the predetermined reference value is greater than a predetermined detection threshold, wherein, with the sensor comprising a reference capacitor and a storage capacitor, the microcontroller is able to command the conversion of the analog voltage signal into a coded digital value between charging of the storage capacitor and complete discharging of the storage capacitor.

5. The device as claimed in claim 4, in which an absolute difference between two consecutive values of the reference voltage is greater than a predetermined detection threshold so as to ensure that the conversions are performed in intervals having non-linearity errors that are different, and thus avoid detection errors.

6. A motor vehicle comprising a device for detecting human presence as claimed in claim 4.

7. A motor vehicle comprising a device for detecting human presence as claimed in claim 5.

* * * * *